United States Patent [19]
Kim

[11] Patent Number: 5,262,337
[45] Date of Patent: Nov. 16, 1993

[54] METHOD OF MAKING A METAL OXIDE SEMICONDUCTOR FIELD EFFECT TRANSISTOR HAVING A CONVEX CHANNEL REGION

[75] Inventor: SHi H. Kim, Seoul, Rep. of Korea
[73] Assignee: Gold Star Electron Co., Ltd., Rep. of Korea
[21] Appl. No.: 849,721
[22] Filed: Mar. 11, 1992
[30] Foreign Application Priority Data
Mar. 13, 1991 [KR] Rep. of Korea ............ 4015/1991[U]
[51] Int. Cl.$^5$ ........................................... H01L 21/336
[52] U.S. Cl. ........................................ 437/35; 437/41; 437/44; 257/336; 257/344
[58] Field of Search ............... 437/35, 41, 44; 357/23.3, 23.4; 257/336, 344

[56] References Cited
U.S. PATENT DOCUMENTS
4,960,723 10/1990 Davies ........................ 437/41
5,041,885 8/1991 Gualandris et al. ........... 357/23.4
5,057,444 10/1991 Fuse et al. ..................... 437/35

FOREIGN PATENT DOCUMENTS
61-97970 5/1986 Japan .
2-7475 1/1990 Japan ....................... 357/23.3
2-122569 5/1990 Japan ....................... 357/23.3
2-156642 6/1990 Japan ....................... 437/35
3-108727 5/1991 Japan ....................... 437/35

Primary Examiner—Mary Wilczewski
Attorney, Agent, or Firm—Faegre & Benson

[57] ABSTRACT

A metal oxide semiconductor field effect transistor (MOSFET) and a method of making the same, capable of avoiding the generating of a high horizontal electric field in low concentration source and drain regions. In accordance with the invention, a p-type substrate is patterned to form a channel region of a convex type thereon. At opposite side portions of the channel region, low concentration source and drain regions are formed which is in turn covered with a gate. High concentration source and drain regions are formed in the portions of the substrate disposed outwardly of opposite side portions of the gate and near the surface of the substrate. Electric fields of low concentration source and drain regions can be controlled by the gate, since the regions are connected to the gate, via the gate oxide layer. As a result, it is possible to avoid the generation of a high horizontal electric field in low concentration source and drain regions.

6 Claims, 3 Drawing Sheets

METHOD OF MAKING A METAL OXIDE SEMICONDUCTOR FIELD EFFECT TRANSISTOR HAVING A CONVEX CHANNEL REGION

BACKGROUND OF THE INVENTION

1. Field of the Invention

The present invention relates to metal oxide semiconductor field effect transistors (MOSFETs) and a method of making the same. More particularly, the present invention relates to MOSFETs having the construction wherein a gate is sandwiched between source and drains, and to a method of making the same.

2. Description of the Prior Art

Referring to FIG. 1, there is shown the construction of a conventional MOSFET. As shown in the drawing, the MOSFET comprises a p-type substrate 1 and a gate 3 having a gate oxide layer 2. The gate 3 has a high concentration n-type source region 4 and a high concentration n-type drain region 4a below its opposite edge portions $r_1$, respectively.

In the construction shown in FIG. 1, a sharp high electric field is formed at both edge portions $r_1$ of the gate 3 when a drive voltage is applied to the gate 3. As a result, hot electrons are generated at opposite edge portions $r_1$ of the gate 3 and trapped in the gate oxide layer 2. The trapped electrons are re-combined with holes distributed in the boundary of the gate oxide layer 2. Consequently, the gate 3 can be driven only when the drive voltage exceeds a predetermined level. In fact, this MOSFET, as illustrated in FIG. 1, is in a disabled state. Thus, MOSFET of the construction of FIG. 1 has a problem of very low reliability.

In order to avoid the reduction of the life time and the reliability of MOSFETs, caused by the generation of hot electrons due to high electric fields formed at gate edges, there has been proposed a MOSFET of a lightly doped drain (LDD) construction shown in FIG. 2.

In the case of the LDD construction of a MOSFET, a gate oxide layer 6 and a gate 7 are formed in turn on a predetermined portion of a p-type substrate 5. On both sides of the gate oxide layer 6 and the gate 7, side wall oxide layers 8 are coated, respectively. A low concentration n-type source region 9 and a low concentration n-type drain region 9a are formed on the substrate 5 below side wall oxide layers 8, respectively. Below respective edge portions $r_3$ of side wall oxide layer 8, a high concentration n-type source region 10 and a high concentration n-type drain region 10a are formed. That is, the gate 7 is provided at its opposite edge portions $r_2$ with a low concentration n-type source region 9 and a low concentration n-type drain region 9a, so as to avoid the generation of hot electrons at the both edge portions $r_1$. In this case, the material of the gate 7 is mainly polysilicon.

The operation of the MOSFET of the construction shown in FIG. 2 will now be described.

Typically, when a channel region is saturated as a high voltage is applied to gate and drain regions, a strong horizontal electric field extending from the drain region to the source region is generated at the region corresponding to the edge portion of the channel region.

In the MOSFET of the LDD construction of FIG. 2, however, the intensity of the horizontal electric field at edge portions $r_1$ is attenuated due to the low concentration n-type drain 9a formed below the corresponding side wall oxide layer 8. As a result, the generation of ion impacts at the both edge portions $r_2$ of the gate 7 is reduced, thereby desirably reducing the trapping of electrons in the gate oxide layer 6.

When a bias voltage is applied to gate 7, however, the electron concentration is greatly lowered at regions $r_2$ of the low concentration n-type drain region 9a, as shown in FIG. 3. This is because a high potential difference occurs in the regions $r_2$ by virtue of the fact that no bias from gate 7 is applied to the side wall oxide layers 8, thereby causing electrons to be concentrated toward the regions $r_2$. Accordingly, many electrons are trapped in the side wall oxide layers 8, through the regions $r_2$ and then re-combined with holes distributed in the boundary between the gate oxide layer 6 and the channel region, thereby increasing the actual bias voltage.

As a result, the manufactured element can not be driven by the bias voltage, which was predetermined in manufacturing the element, so that it becomes disabled. That is, the MOSFET of the construction of FIG. 2 has the disadvantages of a short life time and low reliability, since the peak of the horizontal electric field is not positioned at the region below the gate oxide layer 6 where it could be easily controlled, but at the region $r_2$ below the side wall oxide layer 8.

In other words, the side wall oxide layer 8 is typically formed, for example by chemical vapor deposition (CVD), so that it has a degraded quality, over the gate oxide layer 6 which is formed by thermal oxidation. Over the gate oxide layer 6, therefore, the insulation characteristic of the side wall oxide layer 8 is degraded, thereby causing the electrons to be more easily trapped in the side wall oxide layer 8. This trapping of electrons in the side wall oxide layer 8 results in an undesirable variation of the resistance level of the drain, thereby causing the life time of the manufactured element to be shortened.

Although the disadvantages encountered in the prior art have been described in conjunction with P-type MOSFETs, n-type MOSFETs also encounter the same disadvantages.

SUMMARY OF THE INVENTION

Therefore, an object of the invention is to provide a method of making MOSFETs, wherein low concentration source and drain regions are disposed just below a gate, so that high potential difference can not occur at the predetermined regions of source and drain regions, thereby avoiding the reduction of life time and reliability due to the trapping of electrons in side wall oxide layers.

In one aspect, the present invention provides a metal oxide semiconductor field effect transistor comprising:

a substrate of a first conduction type;

a channel region formed on the substrate and shaped into a convex shape;

a gate formed on the channel region to cover it sufficiently;

low concentration source and drain regions of a second conduction type formed at opposite side portions of the channel region, respectively; and high concentration source and drain regions of the second conduction type formed at the portions of the substrate disposed outwardly of opposite side portions of the gate and near the surface of the substrate, respectively.

In another aspect, the present invention provides a method for forming a metal oxide semiconductor field effect transistor comprising the steps of:

patterning a substrate of a first conduction type by using a mask to form a channel region having a convex shape thereon;

implanting and diffusing low concentration ions of a second conduction type in opposite side portions of the convex channel region to form low concentration source and drain regions at the same portions, respectively;

stripping the mask used for defining the convex channel region and then forming a gate insulation layer on the exposed overall surface of the substrate;

forming a gate on the gate insulation layer such that it covers sufficiently the convex channel region; and implanting and diffusing high concentration ions of the second conduction type in the portions of the substrate disposed outwardly of opposite side portions of the gate and near the surface of the substrate, by using the gate as a mask, to form low concentration source and drain regions at the same portions, respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 4a to 4f, there is illustrated a method of making MOSFETs in accordance with the present invention.

Figure 1:
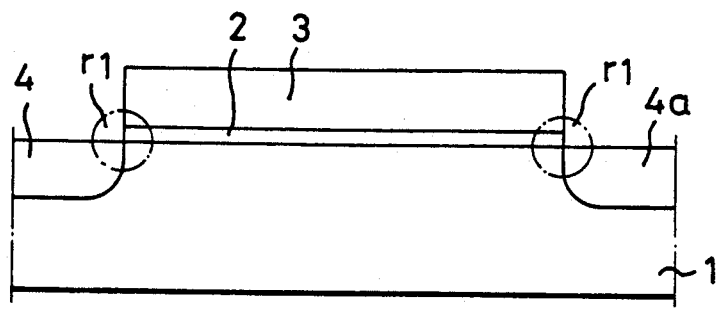
FIG. 1 is a schematic sectional view of the construction of a conventional MOSFET.
Figure 2:
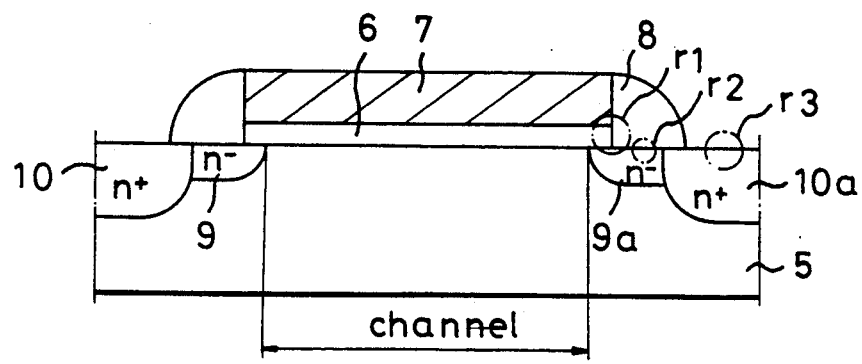
FIG. 2 is a schematic sectional view of the construction of a conventional LDD MOSFET.
Figure 3:
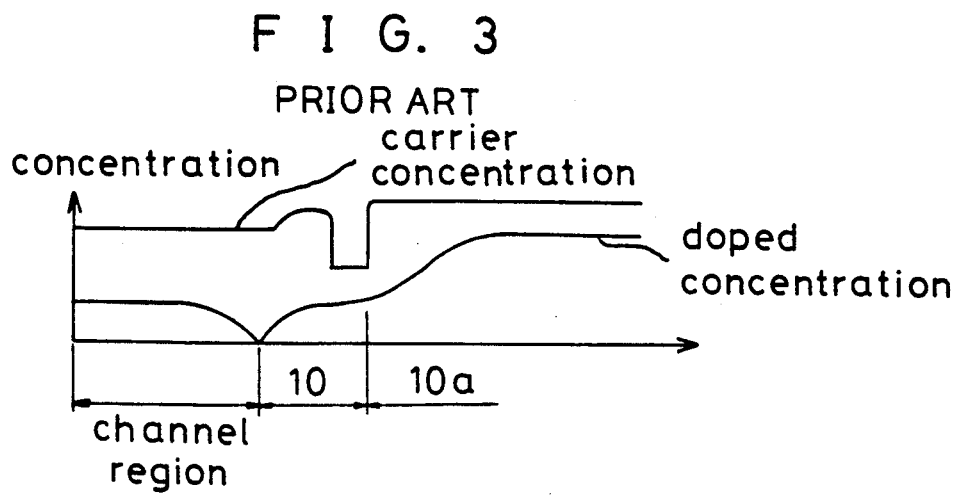
FIG. 3 is a graph illustrating carrier and ion concentration in the construction of FIG. 2.
Figure 4A:
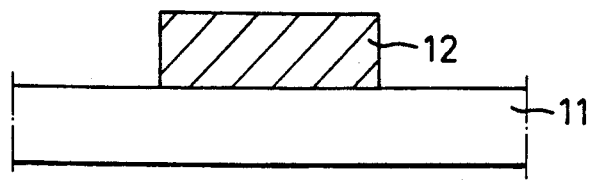
FIGS. 4a to 4f are schematic sectional views illustrating a method of making MOSFETs in accordance with the present invention.
Figure 4B:
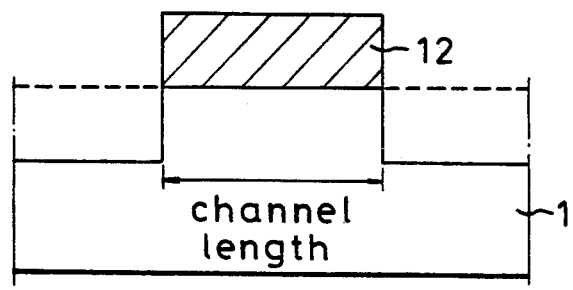
Figure 4C:
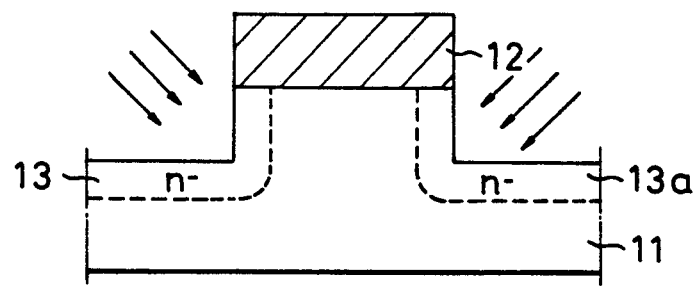

In the method of the present invention, a mask 12 defining a channel region is first formed on the surface of a p-type substrate 11, as shown in FIG. 4a. the p-type substrate 11 is then dry etched by using the mask 12, to form a channel region having a convex shape thereon, as shown in FIG. 4b. The process of forming the channel region of the convex shape may be referred to as a patterning process.

Thereafter, n-type ions of low concentration are implanted in both opposite side portions of the convex channel region and in opposite surface portions of the substrate 11 jointed to respective side portions of the convex channel region. The ion implantation is carried out inclinedly by using a tilt process, as shown by the arrows in FIG. 4c. The p-type substrate 11 is then subjected to a diffusion process, to diffuse implanted ions, so that a low concentration n-type source region 13 and a low concentration n-type drain region 13a are formed at opposite side portions of the channel region and opposite surface portions of the substrate 11 joined to the side portions of the convex channel region, respectively. Herein, it is important that the low concentration n-type source region 13 and the low concentration n-type drain region 13a are at least formed at opposite side portions of the channel region.

Figure 4D:
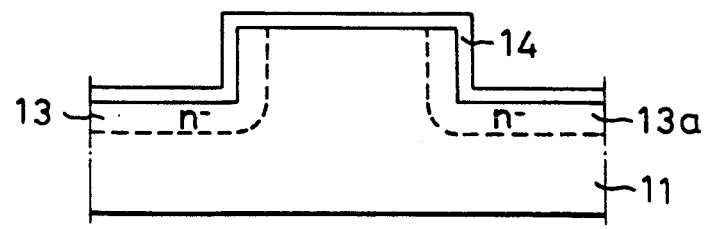

The mask 12, which was used for defining the channel region, is then stripped from the p-type substrate 11, as shown in FIG. 4d. On the exposed overall surface of the substrate 11, a gate oxide layer 14 is subsequently deposited either by using a chemical vapor deposition (CVD) process or grown by using a thermal oxidation process.

Figure 4E:
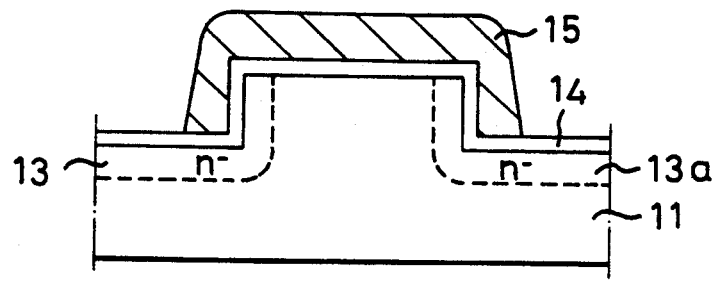

Thereafter, a gate 15 is formed on the surface of the gate oxide layer 14, as shown in FIG. 4e. At this time, the formation of the gate 15 is achieved, such that it covers sufficiently, or substantially entirely, the convex channel region having the low concentration source and drain regions 13 and 13a. A polysilicon is used as the material of the gate 15.

Figure 4F:
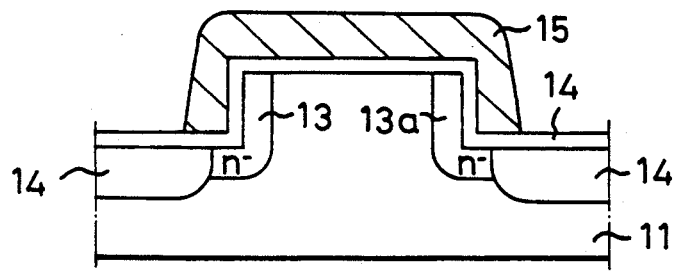

Subsequently, n-type ions of high concentration are implanted in the p-type substrate 11, by using the gate 15 as a mask, as shown in FIG. 4f. The ion implantation is carried out vertically as shown by an arrow Y in FIG. 4f. The p-type substrate 11 is then subjected to a diffusion process step, to diffuse the implanted ions, so that a high concentration n-type source region 16 and a high concentration n-type drain region 16a are formed at the portions of the substrate 11 disposed outwardly of opposite side portions of the gate 15, respectively.

Figure 4G:
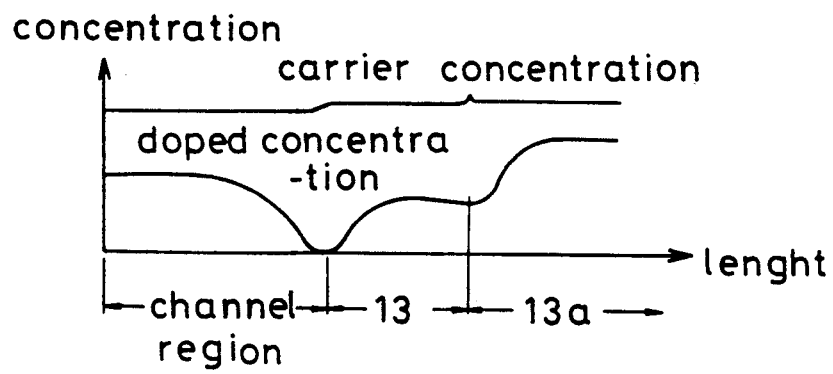
FIG. 4g is a graph illustrating carrier and ion concentration in the construction according to the present invention.

In the MOSFET having the above-mentioned construction, obtained according to the method of the present invention, when the channel region is saturated as a high voltage is applied to gate and drain regions, electrons are distributed uniformly throughout the length of the channel region. That is, the channel region has a uniform electron concentration density, throughout the length thereof. This uniform concentration of electrons throughout the length of the channel region is apparent from a carrier concentration curve of FIG. 4g.

In the MOSFET of the present invention, accordingly, there is no problem that a strong horizontal electric field is generated at the region corresponding to the edge portion of the channel region. That is, when a bias is applied to the gate 15, the same bias is applied to low concentration n-type source and drain regions 13 and 13a, as well as the channel region, since low concentration n-type source and drain regions 13 and 13a are covered with the gate 15. As a result, it is possible to solve the problem of short life time and low reliability caused by a high potential difference occurring in specific regions.

In accordance with the present invention, it is unnecessary to use side wall oxide layers, by virtue of the above-mentioned construction. Furthermore, electric fields of low concentration source and drain regions can be controlled by the gate, since the regions are connected to the gate, via the gate oxide layer.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method of forming a metal oxide semiconductor field effect transistor comprising the steps of:
   (a) forming a mask for defining a channel region on a substrate of a first conduction type;

(b) etching said substrate by using said mask to form a convex channel region thereon having an upper surface and a pair of opposed side portions;

(c) implanting and diffusing a low concentration of ions of a second conduction type in both side portions of said convex channel region and an adjacent surface of said substrate by using said mask to form low concentration source and drain regions at the same portions; respectively;

(d) stripping said mask and then forming a gate insulation layer on the whole surface of said substrate;

(e) forming a gate on the gate insulation layer such that the gate covers the upper surface and side portions of the convex channel region; and (f) implanting and diffusing a high concentration of ions of the second conduction type in portions of the substrate corresponding to both side portions of the gate by using the gate as a mask, to form high concentration source and drain regions at the same portions respectively.

2. A method in accordance with claim 1, wherein said gate insulation layer is formed by thermal oxidation.

3. A method in accordance with claim 1, wherein said implantation of high concentration ions having a second conduction type is carried out vertically.

4. A method in accordance with claim 1, wherein said mask for defining a channel region is photoresist.

5. The method in accordance with claim 1, wherein said implantation of low concentration ions having a second conduction type is carried out inclinedly by a tilt process.

6. A method in accordance with claim 9, wherein said tilt ion implantation is carried out at angles causing the ions to impinge the opposite side portions of the channel region and the surfaces of the substrate adjacent side portions of the channel region.

* * * * *

UNITED STATES PATENT AND TRADEMARK OFFICE
CERTIFICATE OF CORRECTION

PATENT NO. : 5,262,337
DATED : November 16, 1993
INVENTOR(S) : Shi H. Kim It is certified that error appears in the above-identified patent and that said Letters Patent is hereby corrected as shown below:

On the title page, item [75], delete "SHi" and insert --Shi--
Column 6, line 14, delete "9" and insert --5--

Signed and Sealed this

Nineteenth Day of April, 1994

Attest:

BRUCE LEHMAN

*Attesting Officer*  *Commissioner of Patents and Trademarks*